United States Patent [19]

Loth et al.

[11] Patent Number: 5,021,101

[45] Date of Patent: Jun. 4, 1991

[54] METHOD OF MANUFACTURE OF A COPPER WATCH CASE

[75] Inventors: Eric Loth; Pierre-Alain Walder, both of Bienne, Switzerland

[73] Assignee: ETA SA Fabriques d'Ebauches, Grenchen, Switzerland

[21] Appl. No.: 453,929

[22] Filed: Dec. 20, 1989

[30] Foreign Application Priority Data

Dec. 21, 1988 [CH] Switzerland .................... 04731/88-0

[51] Int. Cl.[5] .......................... C21D 1/78; G04B 37/22; C23C 16/06; C23C 30/00

[52] U.S. Cl. .................................... 148/11.5 C; 148/2; 148/12.7 C; 29/527.4

[58] Field of Search ..................... 148/11.5 C, 12.7 C, 148/2; 29/527.4

[56] References Cited

U.S. PATENT DOCUMENTS

| | | | |
|---|---|---|---|
| 1,535,542 | 4/1925 | Price | 420/473 |
| 2,234,552 | 3/1941 | Dean et al. | 148/32 |
| 2,393,906 | 1/1946 | Hensel et al. | 308/242 |
| 4,758,280 | 7/1988 | Bergmann et al. | 106/286.4 |

FOREIGN PATENT DOCUMENTS

| | | |
|---|---|---|
| 3235832 | 4/1984 | Fed. Rep. of Germany . |
| 352965 | 4/1961 | Switzerland . |
| 543764 | 12/1973 | Switzerland . |
| 154669 | 10/1963 | U.S.S.R. . |
| 1207807 | 10/1970 | United Kingdom . |

OTHER PUBLICATIONS

Chem. Abs. 111(8): 62334f, 4/88.

*Primary Examiner*—Richard O. Dean
*Assistant Examiner*—Margery S. Phipps
*Attorney, Agent, or Firm*—Griffin Branigan & Butler

[57] ABSTRACT

The method of manufacture of this watch case consists in employing a material including at least 95% copper in its composition, the remainder being made up of elements adapted to increase the mechanical strength of the copper while avoiding the toxic elements beryllium and cadmium. Thanks to this material the watch case may be stamped out in a single operation, hardened, then covered with a protective layer deposited galvanically or by a PVD process.

8 Claims, No Drawings

METHOD OF MANUFACTURE OF A COPPER WATCH CASE

This invention concerns a method of manufacture of a watch case formed of a material including at least 95% copper by weight.

BACKGROUND OF THE INVENTION

A watch case formed of an equally substantial percentage of copper has already been proposed in the patent document CH-A-543 764. Herein the manufacturing process of elements making up a watch case is characterized by the fact that one employs a copper beryllium alloy adapted to structural hardening by heat treatment, one machines said elements, then deposits on the exterior thereof a non-oxydizing layer of metallic material. The document also indicates that the copper beryllium alloy includes at least 1.8% and at most 2.05% of beryllium and that the heat treatment permitting structural hardening thereof comprises annealing effected at 320° C. over a period of at least two hours. Further, in accordance with this document, the method proposed also enables obtaining, by known and tested means such as stamping, turning, threading, piercing, milling as well as machining by means of diamond tools and by simple heat treatment, a strong watch case all the elements of which may receive a surface hardening treatment enabling the watch to maintain intact a pleasing and almost unchangeable appearance during an almost unlimited time period, even if it is worn under very severe conditions.

From the description which has just been given, it may be assumed that machining of a watch case employing the base material as described is not particularly simple in the sense that it requires several successive operations in order to arrive at the case in its final state. This is probably due to the employment of beryllium which renders the copper brittle and not very malleable which thus necessitates operation by stages prior to obtaining the finished product.

Beryllium alloyed with copper or bronze finds electrical applications where it has been frequently employed as spring electrical contacts. It however presents a serious difficulty which is that of being toxic. Beryllium and its salts must be handled with the greatest of care. It must not be touched in order to check the effect of softness which it exhibits. It is thus necessary to observe a certain work discipline when it is known that a concentration in the atmosphere exceeding two milligrams per cubic meter is dangerous. For these reasons at present beryllium and its alloys are difficult to stock as is likewise difficult the problem of handling and treating the waste.

The patent document SU 154 669 describes an electrically conducting alloy having a base of at least 95% copper, the remainder including cadmium among others. It is known that cadmium is toxic and must be avoided at all costs.

The employment of copper in the pure state presents however a great interest which is that of being readily deformable in the cold state and frequently to require only a single operation to arrive at the object sought for. Pure copper however presents insufficient mechanical strength for certain employments as here the obtaining of a watch case. It will be noted also that the cold forming of pure copper may bring about cracking thereof. It is thus necessary to improve the mechanical resistance by adding to the copper certain elements which enable increasing its rigidity and hardness and this whilst avoiding the employment of toxic elements such as beryllium and cadmium.

SUMMARY OF THE INVENTION

Thus, in order to avoid the difficulties mentioned in respect of the documents cited hereinabove, the method of manufacture of the watch case according to the invention includes the steps of providing a material including at least 95% copper by weight, the remainder being made up of elements adapted to increase the mechanical strength of the copper whilst excluding beryllium and cadmium, cold forming said material in a single operation in order to provide at least one element of the watch case, said operation simultaneously constituting a drawing operation tending to increase the hardness of the material, and coating said watch case element with a protective and decorative layer.

The invention will now be described in detail in explaining several methods of manufacture of a watch case given by way of example.

DESCRIPTION OF THE PREFERRED EMBODIMENTS

To obtain its watch case the assignee of this invention has employed material which to the best of its knowledge has only been employed in the electrical industry as conductors or elastic contacts. Very generally, at least one of the parts forming the watch case is made of a material including at least 95% copper by weight, the remainder being formed of elements adapted to increase the mechanical resistance of the copper whilst excluding beryllium and cadmium. Furthermore, this material is coated by a layer serving for the protection and decoration of the watch case.

Numerous trials have served to demonstrate that the material defined hereinabove, never proposed for the manufacturer of a watch case, responds in all essential points to the objectives sought after: very high copper content which permits very easy cold forming of the material; presence for instance of nickel, of lead and of phosphorus which improves the mechanical characteristics of the material without turning back to beryllium or to cadmium, while at the same time making possible a subsequent heat treatment.

In particular, the following composition gives excellent results and may constitute a preferred composition: copper: 98.2%, nickel: 1%, lead: 0.55% and phosphorus: 0.22%. By adding up these figures it is seen that there remains a percentage of 0.03% which is generally covered by residual impurities inherent in cupreous alloys. It will be mentioned that the remaining elements are not limited to nickel, lead and phosphorus, but may include for instance manganese or tin.

The material indicated may be employed for manufacturing only the caseband of the watch case, such caseband being adapted to include a bezel which may be integral or subsequently attached. If it concerns a watch case for a wrist watch, the caseband may also bear bracelet attaching lugs. Caseband and lugs may then be formed integrally with the indicated material. It is self evident that the back cover of the watch case may also be formed of this same material.

In order to fashion the watch case, one proceeds in accordance with the invention in the following manner:

One commences by providing the material described hereinabove, this material including at least 95% copper, the remainder being composed of elements adapted to increase the resistance of the copper, whilst excluding beryllium and cadmium. This material may be provided in strip form in order to facilitate production in series. The preferred composition as indicated hereinabove may be chosen for the excellent results which it gives.

The material is then cold formed in a single operation. This forming is brought about by means of a tool adapted at the same time to effect blanking and then drawing of the chosen material in order to give the watch case its final form which may be that of its caseband provided with the lugs. The cold forming in a single operation or in a single stroke is very advantageous for tooling economy and time saving which it exhibits.

It will be understood that the material or at least the surface zones of this material will be work hardened during the drawing or stamping operation, this contributing to the hardening thereof and thus rendering it mechanically stronger.

The presence of elements such as nickel, for instance, permits furthermore the thermal hardening of the material and this between the cold forming operation and the coating operation. For that one introduces the product as obtained into an oven heated to about 400° C.

The part thus obtained exhibits an unattractive red aspect which is not particularly resistant to corrosion. One will thus coat it with a layer which serves at the same time to protect it and to decorate it. This coating may be obtained in various manners, for instance by galvanic deposition or by physical vapour deposition (PVD). One may deposit galvanically for instance chrome, nickel or gold, this deposition being facilitated by the fact that the substrate is of copper. One may deposit the same elements by PVD and as well very hard layers such as titanium nitride or tungsten carbide, such layers being much more resistant to scratching.

To improve the surface state of the object prior to coating, one may proceed with an electrochemical or electrolytic polishing. This type of polishing, which is impossible with brass, advantageously replaces the mechanical polishing presently employed but expensive in time.

The PVD deposition on cupreous alloys here calls for a substantial commentary. It will be noted initially that the cupreous alloy most often employed to manufacture a watch case is brass. Brass contains a substantial percentage of zinc which renders it unfit to receive a protective layer by PVD methods. Effectively, the PVD deposit is provided under vacuum (between $10^{-2}$ and $10^{-4}$ mbar) and a relatively high temperature (between 200° C. and 400° C.), and the zinc becomes volatile and evaporates during the treatment; this from the fact that its vapour pressure is not negligible under the mentioned conditions. Such evaporation brings about an irregular deposition, which is not very resistant, of the final layer to be applied and finally an inadmissible aspect of the finished part. To avoid this difficulty it has been proposed to coat the brass with a galvanic underlayer (for instance copper and/or nickel) onto which the PVD deposition may be effected without difficulty. In order to avoid this extra operation, there will be preferably chosen a material which does not contain zinc and more generally material including elements (in addition to the copper), the vapour pressure of which is substantially zero in the constraint conditions necessary to the application of a layer by the PVD process. This is the case for copper, nickel and lead. It is not the case for phosphorus but its presence is so small (0.22%) that it may be considered as having no influence on the good quality of the coating.

The coating by the PVD process presents a further advantage which is that of economizing on the thermal hardening operation, this hardening taking place at the same time as the coating since the temperature of coating (between 200 and 400° C.) is substantially the same as the hardening temperature.

What we claim is:

1. A method of manufacture of a watch case comprising the following steps:

providing a material consisting essentially of at least 95% copper by weight, and a remainder containing one or more elements selected from the group consisting of nickel, lead, phosphorus, tin and manganese; said elements increasing the mechanical strength of the copper, cold forming said material in a single operation in order to provide at least one element of the watch case, said operation simultaneously constituting a drawing operation tending to increase the hardness of the material, coating said watch case element with a protective and decorative layer.

2. A method as set forth in claim 1 wherein the elements making up the remainder are nickel, lead and phosphorus.

3. A method as set forth in claim 1 wherein the material includes 98.2% copper by weight, the remainder being made up of 1% nickel, 0.55% lead and 0.22% phosphorus.

4. A method as set forth in claim 1 wherein the cold forming operation provides the caseband for the watch case.

5. A method as set forth in claim 4 wherein the cold forming operation simultaneously forms bracelet attachment lugs integral with the caseband.

6. A method as set forth in claim 1 wherein following the cold forming operation and prior to the coating operation the watch case element is heated to effect thermal hardening thereof.

7. A method as set forth in claim 1 wherein the protective and decorative layer is galvanically deposited.

8. A method as set forth in claim 1 wherein the protective and decorative layer is applied by physical vapour deposition (PVD), the material provided including remaining elements the vapour pressure of which is substantially zero when said material is subjected to a pressure comprised in the range between $10^{-2}$ and $10^{-4}$ mbar and a temperature comprised in the range between 200° C. and 400° C.

* * * * *